(12) United States Patent
Park et al.

(10) Patent No.: US 6,990,543 B2
(45) Date of Patent: Jan. 24, 2006

(54) MEMORY MODULE WITH IMPROVED DATA BUS PERFORMANCE

(75) Inventors: Myun-joo Park, Incheon (KR); Byung-se So, Sungnam (KR)

(73) Assignee: Samsung Electronics, Co., Ltd., (KR)

( * ) Notice: Subject to any disclaimer, the term of this patent is extended or adjusted under 35 U.S.C. 154(b) by 0 days.

(21) Appl. No.: 10/883,488

(22) Filed: Jul. 1, 2004

(65) Prior Publication Data
US 2004/0260859 A1    Dec. 23, 2004

Related U.S. Application Data

(63) Continuation of application No. 09/777,446, filed on Feb. 6, 2001, now Pat. No. 6,772,262.

(30) Foreign Application Priority Data

Jun. 9, 2000    (KR) .................................. 00-31665

(51) Int. Cl.
*G11C 8/00* (2006.01)
(52) U.S. Cl. .................... 710/301; 365/52; 361/736
(58) Field of Classification Search ............ 710/100, 710/301; 711/5, 100; 361/736, 788; 365/52, 365/53, 63, 226, 269
See application file for complete search history.

(56) References Cited

U.S. PATENT DOCUMENTS

| | | | | |
|---|---|---|---|---|
| 5,513,135 A | * | 4/1996 | Dell et al. .................... | 365/52 |
| 5,680,342 A | | 10/1997 | Frankeny ..................... | 365/52 |
| 5,996,880 A | * | 12/1999 | Chu et al. ............. | 228/180.21 |
| 6,028,781 A | | 2/2000 | Vogley et al. ................ | 365/52 |
| 6,109,929 A | | 8/2000 | Jasper ........................ | 439/74 |
| 6,266,252 B1 | | 7/2001 | Karabatsos .................. | 361/788 |
| 6,349,050 B1 | * | 2/2002 | Woo et al. ..................... | 365/51 |
| 6,353,539 B1 | | 3/2002 | Horine et al. ............... | 361/736 |
| 6,392,897 B1 | | 5/2002 | Nakase et al. .............. | 361/785 |
| 6,414,869 B1 | * | 7/2002 | Kao et al. ..................... | 365/52 |
| 6,414,904 B2 | | 7/2002 | So et al. ..................... | 365/239 |
| 6,438,012 B1 | | 8/2002 | Osaka et al. .................. | 365/52 |
| 6,487,086 B2 | | 11/2002 | Ikeda .......................... | 361/772 |
| 6,542,373 B1 | | 4/2003 | Oba ............................ | 361/760 |
| 6,594,167 B1 | | 7/2003 | Yamasaki et al. ............. | 365/51 |
| 6,742,098 B1 | * | 5/2004 | Halbert et al. .............. | 711/172 |

FOREIGN PATENT DOCUMENTS

| | | |
|---|---|---|
| DE | 101 11 998 A1 | 11/1985 |
| JP | 11251539 | 9/1999 |
| JP | 2000031614 | 1/2000 |

* cited by examiner

*Primary Examiner*—Glenn A. Auve
(74) *Attorney, Agent, or Firm*—Mills and Onello, LLP

(57) ABSTRACT

A memory module is capable of constituting short loop-through form memory bus systems in which the length of the entire channel can be reduced. As a result, the systems are suitable for a high-speed operation, and costs for fabricating systems such as a board and a module connector can be reduced. The memory module includes a plurality of tabs located in one side of the front and in one side on the rear of the memory module, for being interconnected by a connector on a system board, a plurality of vias for connecting two different signal layers of the memory module, and a plurality of data buses extended from the tabs on the front of the memory module to the tabs on the rear of the memory module through each of the vias. At least one memory device is connected to each of the data buses. Preferably, each of the data buses is formed to be perpendicular to one side of the memory module on which the tabs are formed.

20 Claims, 8 Drawing Sheets

MEMORY MODULE WITH IMPROVED DATA BUS PERFORMANCE

RELATED APPLICATIONS

This application is a continuation of U.S. application Ser. No. 09/777,446, filed Feb. 6, 2001 now U.S. Pat. No. 6,772,262, which relies for priority upon Korean Patent Application No. 00-31665, filed on Jun. 9, 2000, the contents of which are herein incorporated by reference in their entirety.

BACKGROUND OF THE INVENTION

1. Field of the Invention

The present invention relates to a memory module, and more particularly, to a memory module with improved data bus performance.

2. Description of the Related Art

Memory devices continue to evolve, with the focus being on high density and large capacity based on high density. At the same time, central processing units (CPU) of computer systems continue to undergo development, with the focus being high-speed. As a result, in computer systems, it is common for the difference in operating speed between the CPU and the memory device to be large; so large, that in contemporary systems, the operating speed of the memory device is typically the primary factor in restricting overall system performance.

In order to improve system operating speed, high-speed memory devices and high-performance memory systems are under development. In high-performance memory systems the goal is to process input/output data within a given unit time. For such high-speed memory systems, firstly, the high-speed memory device must be developed, and secondly, module and bus architectures enabling high-speed of an input/output interface for interconnecting the memory device and the exterior of the memory device are also very important.

In general, a conventional bus architecture of the memory systems is classified into a stub-form and a loop-through form. FIG. 1 is a diagram illustrating a conventional stub-form memory bus architecture, and FIG. 2 is a diagram illustrating a conventional loop-through form memory bus architecture.

Referring to FIG. 1, in the conventional stub-form memory bus architecture, a bus 11 is provided on a system board, and each memory device 15 on a memory module 13 coupled to the system board is connected to the bus 11 through a stub 17 on the module 13. The stub 17 diverges from the bus 11 through a module socket 19.

Referring to FIG. 2, in the conventional loop-through form memory bus architecture, each memory device 25 on a memory module 23 is consecutively directly connected to a bus 27 on the module 23 without a stub. The bus 27 on the module 23 is connected to a bus 21 located on a system board through a module socket 29.

In FIGS. 1 and 2, the buses 11 and 21 are connected to memory controllers 10 and 20.

In the conventional stub-form bus architecture of FIG. 1, since the entire length of a channel, that is, the entire length of the bus 11 is relatively short, signal transmission delay time through the channel is likewise short, and, therefore, electron wave interference is small. However, due to the stub architecture, discontinuity and impedance mismatching occur on the channel, and as a result, reflected wave noise is generated. As a result, during high-speed operation, due to the effect of the reflected wave noise, serious distortion occurs in the waveform of a signal on the channel. That is, in the stub-form bus architecture, due to the reflected wave noise on the channel, signal integrity deteriorates.

Thus, in the stub-form bus architecture, in order to improve signal integrity, a stub resistance is provided on the bus. As a result of the increased resistance, the driving voltage of a driver in the memory controller 10 and the driving voltage of a driver in the memory device 15 are also increased, and therefore, power consumption is increased.

Meanwhile, in the conventional loop-through form bus architecture of FIG. 2, since the entire channel consisting of the bus 21 located on the system board and the bus 27 on the module 23 has an uniform impedance, impedance mismatching is reduced, and thus, reflected wave noise is greatly reduced, as compared to the stub-form. Also, since the stub and the stub resistance are not required in the above architecture, the driving voltage of a driver in the memory controller 20 and the driving voltage of a driver in the memory device 25 are relatively smaller, and thus, power consumption is reduced.

Arising from the above advantages in the loop-through form bus architecture, it is generally evident that the loop-through form bus architecture of FIG. 2 is more suitable for a high-speed operation, as compared to the stub-form bus architecture of FIG. 1. However, as known from FIG. 2, in the loop-through form bus architecture, the length of the entire channel is very long, as compared to the conventional stub-form bus architecture of FIG. 1. As a result, the signal transmission delay time on the channel is long, and the electron wave interference is large, and, as a consequence, high-speed performance is restricted. Also, in the loop-through form of FIG. 2, relatively more memory devices are mounted on the channel, as compared to the stub-form of FIG. 1. Thus, capacity load is increased, and the impedance of the channel is reduced. The low impedance of the channel is a factor contributing to increased costs for fabricating systems such as a printed circuit boards (PCBs) and a module connectors.

SUMMARY OF THE INVENTION

To address the above limitations, it is an object of the present invention to provide a memory module, which is capable of constituting short loop-through form memory bus systems in which the length of the entire channel can be reduced, and then, the systems are suitable for a high-speed operation, and costs for fabricating systems such as a printed circuit board (PCB) and a module connector can be reduced.

Accordingly, to achieve the above object, there is provided a memory module in which a plurality of memory devices are mounted. The memory module includes a plurality of tabs located on one side of the front and on one side on the rear of the memory module, for being interconnected by a connector on a system board, a plurality of vias for connecting two different signal layers of the memory module, and a plurality of data buses extended from the tabs on the front of the memory module to the tabs on the rear of the memory module through each of the vias, in which at least one memory device is connected to each of the data buses.

Each of the data buses is formed to be perpendicular to one side of the memory module on which the tabs are formed.

According to a first preferred embodiment of the present invention, the memory module further includes a control/address bus extended from the tabs on the front of the memory module to the tabs on the rear of the memory through one of the vias, and a control/address stub diverged from a point of the control/address bus and commonly connected to the memory devices.

In the first embodiment, the memory module further includes a buffer or a register for driving the control/address stub at the diverged point. Also, in the first embodiment, preferably, the control/address stub is formed to be parallel with one side of the memory module on which the tabs are formed, and the control/address bus is formed to be perpendicular to one side of the memory module on which the tabs are formed.

According to a second preferred embodiment of the present invention, the memory module further includes control/address bus extended from the tabs on the front of the memory module to the tabs on the rear of the memory through one of the vias, a first control/address stub diverged from a point of the control/address bus and commonly connected to memory devices, which is mounted on the front of the memory module, and a second control/address stub diverged from a point of the control/address bus and commonly connected to memory devices, which is mounted on the rear of the memory module.

In the second embodiment, the memory module further includes a buffer or a register for driving the first control/address stub at the diverged point and a buffer or a register for driving the second control/address stub at another diverged point. Also, in the second embodiment, preferably, the first and second control/address stubs are formed to be parallel with one side of the memory module on which the tabs are formed, and the control/address bus is formed to be perpendicular to one side of the memory module on which the tabs are formed.

According to a third preferred embodiment of the present invention, the memory module further includes control/address bus extended from the tabs on the front of the memory module to the tabs on the rear of the memory through one of the vias, and a control/address stub diverged from a point of the control/address bus, in which the memory devices mounted on the front of the memory module and the memory devices mounted on the rear of the memory module are commonly connected to control/address stub.

In the third embodiment, the memory module further includes a buffer or a register for driving the control/address stub at the diverged point. Also, in the third embodiment, preferably, the control/address stub is formed to parallel with one side of the memory module on which the tabs are formed, and the control/address bus is formed to be perpendicular to one side of the memory module on which the tabs are formed.

According to a fourth preferred embodiment of the present invention, the memory module further includes control/address bus formed in a loop-through shape and extended from one pin of the tabs to another pin of the tabs and commonly connected to the memory devices.

In the fourth embodiment, preferably, the control/address bus is formed to be parallel with one side of the memory module on which the tabs are formed.

According to a fifth preferred embodiment of the present invention, the memory module further includes control/address bus formed in a loop-through shape passing the front and rear of the memory module through the vias and extended from one pin of the tabs to another pin of the tabs, and the memory devices mounted on the front of the memory module and the memory devices mounted on the rear of the memory module are commonly connected to the control/address bus.

In the fifth embodiment, preferably, the control/address bus is formed to be parallel with one side of the memory module on which the tabs are formed.

In alternative embodiments, one of the plurality of data buses and the control/address bus may be configured in a short loop-though configuration, while the other is configured in a stub configuration.

BRIEF DESCRIPTION OF THE DRAWINGS

The above object and advantages of the present invention will become more apparent by describing in detail preferred embodiments thereof with reference to the attached drawings in which.

DETAILED DESCRIPTION OF PREFERRED EMBODIMENTS

Figure 3:
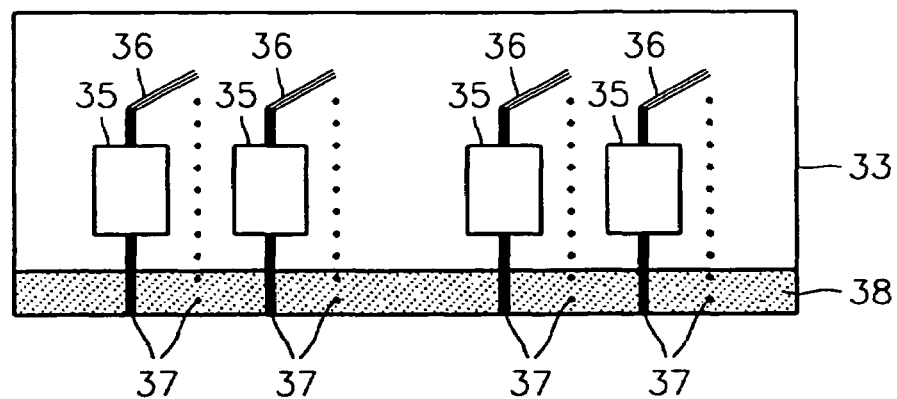
FIG. 3 is a diagram illustrating a memory module according to the present invention.

Referring to FIG. 3, a memory module 33 includes a plurality of memory devices 35, a plurality of vias 36, a plurality of data buses 37, and a tab 38. In FIG. 3, the data buses 37 constitute four channels.

The vias 36 connect two different signal layers of the memory module 33, for example extending from a front portion of the module to a rear portion of the module. The tab 38 interconnects a connector on a system board, that is, a module socket, and is located in one side of the front and in one side on the rear of the memory module 33. In other words, the tab 38 is located in a horizontal lower side of the front and rear of the module 33 of FIG. 3 and includes input pins and output pins.

In particular, the data buses 37 have a short loop-through architecture, and each of the data buses 37 extends from the tab 38 on the front of the module 33 to the tab 38 on the rear of the module 33 through each of the vias 36, and at least one memory device is connected to each of the data buses 37. In FIG. 3, one memory device is connected to each of the data buses 37. That is, each of the data buses 37 extends from the tab 38 on the front of the module 33 to each of the memory devices 35 and extends from the memory devices 35 to the tab 38 on the rear of the module 33 through each of the vias 36. The tab 38 on the front of the module 33 includes an input pin for each of the data buses, and the tab 38 on the rear of the module 33 includes an output pin for each of the data buses.

Preferably, each of the data buses 37 is formed to be perpendicular to one side of the module 33 on which the tab 38 is formed, that is, in a vertical direction.

Figure 4:
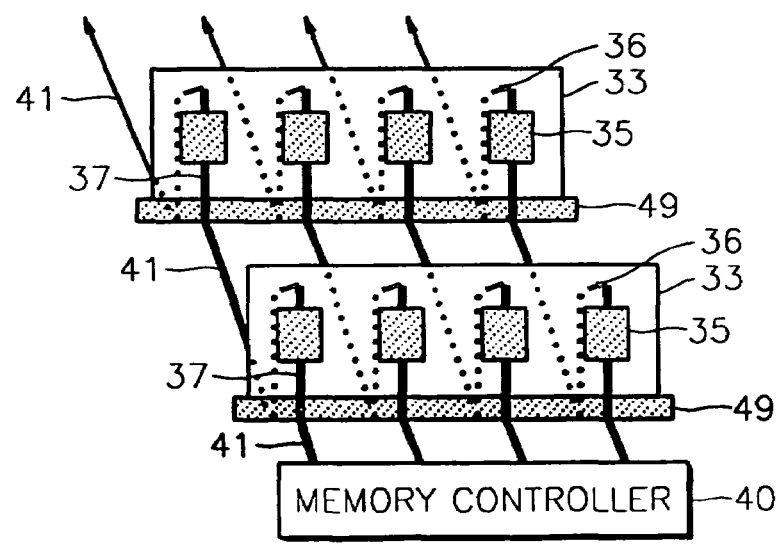
FIG. 4 is a diagram illustrating a short loop-through form memory bus architecture using the memory module according to the present invention of FIG. 3.

Referring to FIG. 4, in the loop-through form memory bus architecture using a memory module 33 according to the present invention, each of data buses 37 on the module 33 passes a module socket 49 contacting the tab (38 of FIG. 3) and is connected to each of data buses 41 on a system board. Each of the data buses 41 on the system board is connected to a memory controller 40.

Figure 1:
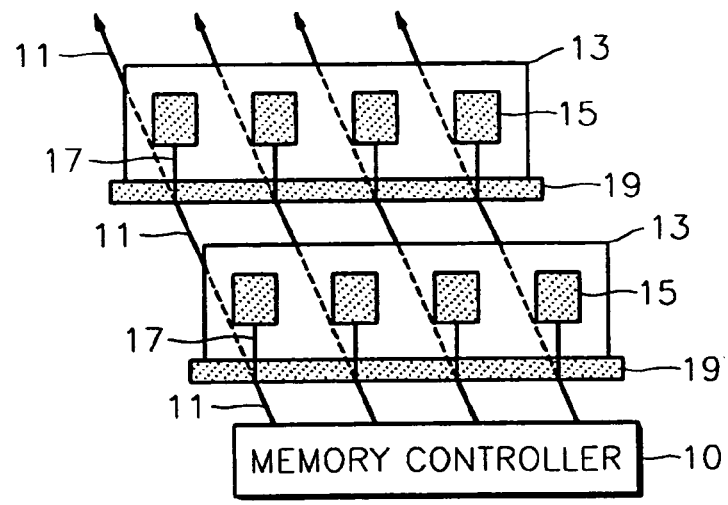
FIG. 1 is a diagram illustrating a conventional stub-form memory bus architecture.
Figure 2:
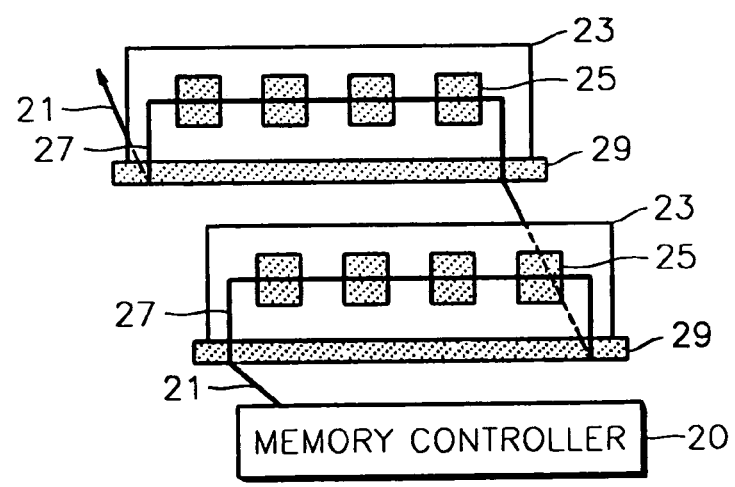
FIG. 2 is a diagram illustrating a conventional loop-through form memory bus architecture.

As described above, the memory module according to the present invention of FIG. 3 employs a loop-through form in which the memory devices 35 are direct connected to the data buses 37 without a stub. However, since the memory module has a short loop-through form data bus architecture in which the data buses 37 are arranged in a vertical direction of the module 33, the length of the entire channel is very much reduced, as compared to a conventional loop-through form of FIG. 2.

Figure 5:
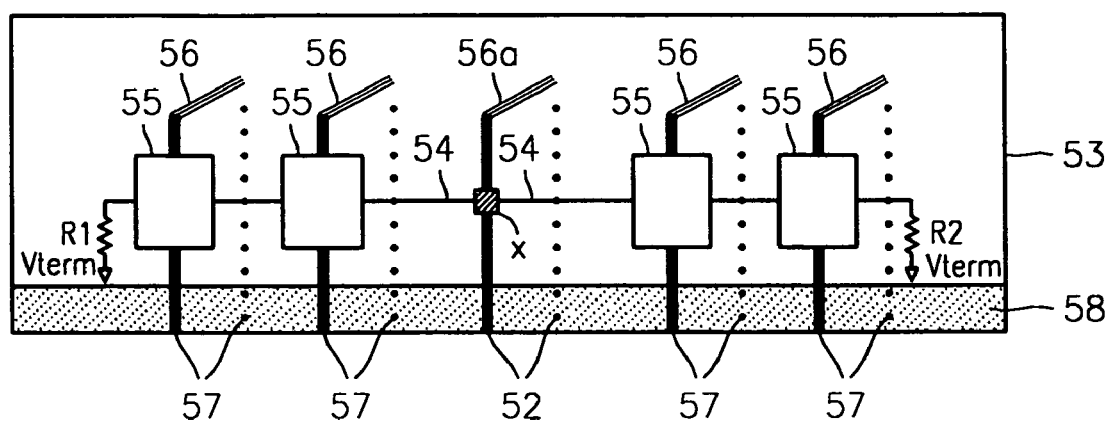
FIG. 5 is a diagram illustrating a first embodiment of the memory module according to the present invention of FIG. 3.

Referring to FIG. 5, a memory module 53 according to a first embodiment of the present invention includes a plurality of memory devices 55, a plurality of vias 56 and 56a, a plurality of data buses 57, a control/address bus 52, a control/address stub 54, a tab 58, and stub terminating resistances R1 and R2. In FIG. 5, the data buses 57 are constituted of a short loop-through form, and the control/address bus 52 is constituted of a short loop-through form to which a stub is added, and four memory devices are mounted on the front of the memory module 53.

The memory devices 55, the vias 56, the data buses 57, and the tab 58 are the same as those of FIG. 3. Thus, detailed descriptions thereof will be omitted.

The control/address bus 52 has a short loop-through architecture and extends from the tab 58 on the front of the module 53 to the tab 58 on the rear of the module 53 through one of the vias 56a. The control/address stub 54 also diverges from a point x of the control/address bus 52. Each of the data buses 57 is connected to one memory device, and all memory devices 55 are commonly connected to the control/address stub 54.

Preferably, the control/address stub 54 is formed in a direction of one side of the module 53 on which the tab 58 is formed, that is, in a horizontal direction, and each of the data buses 57 having a short loop-through form and the control/address bus 52 are formed to be perpendicular to one side of the module 53, that is, in a vertical direction.

Each of the stub terminating resistances R1 and R2 is connected between both ends of the control/address stub 54 and a termination voltage Vterm. A buffer or a register for driving the control/address stub 54 may be included at the divergence point x in order to improve high-speed operation characteristics.

Figure 6A:
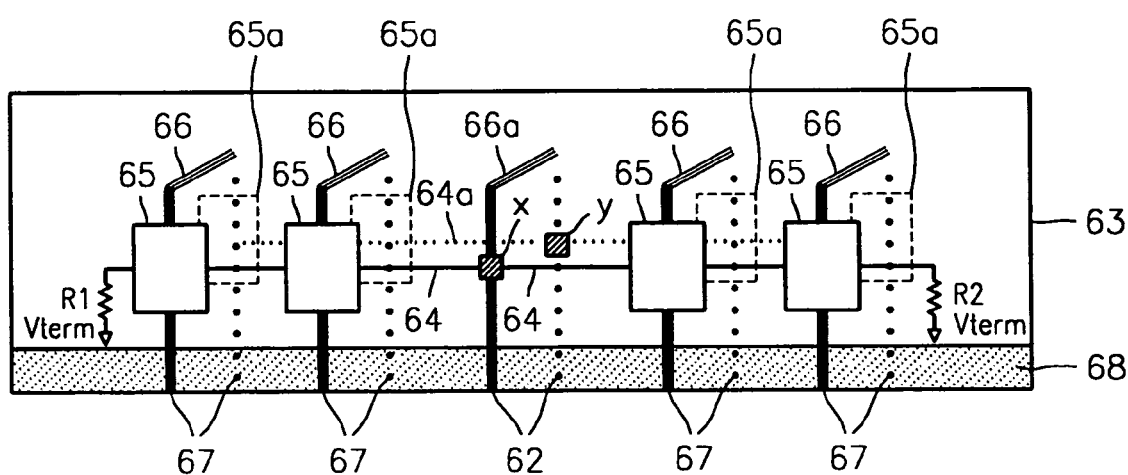
FIG. 6A is a diagram illustrating a second embodiment of the memory module according to the present invention of FIG. 3.
Figure 6B:
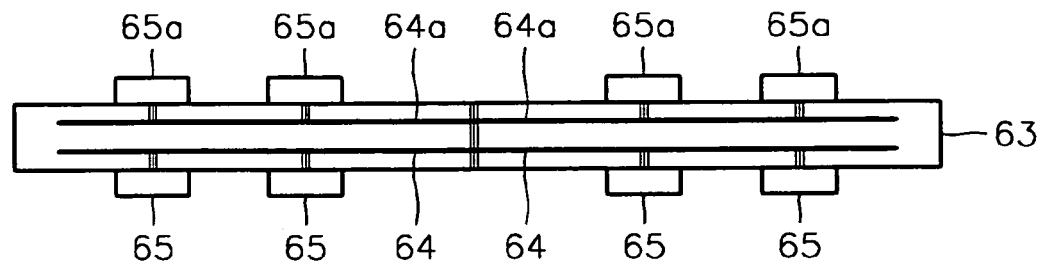
FIG. 6B is a profile illustrating the memory module according to the second embodiment of the present invention of FIG. 6A.

Referring to FIGS. 6A and 6B, a memory module 63 according to a second embodiment of the present invention includes a plurality of memory devices 65 which are mounted on the front of the module 63, a plurality of memory devices 65a which are mounted on the rear of the module 63, a plurality of vias 66 and 66a for connecting two different signal layers of the module 63, a plurality of data buses 67, a control/address bus 62, control/address stubs 64 and 64a, a tab 58, and stub terminating resistances R1 and R2. In FIG. 6A, the data buses 67 are constituted of a short loop-through form, and the control/address bus 62 is constituted of a short loop-through form to which a stub is added, and four memory devices are mounted on the front and rear of the memory module 63, respectively.

Each of the data buses 67 extends from the tab 68 on the front of the module 63 to the tab 68 on the rear of the module 63 through each of the vias 66, and two memory devices are connected to each of the data buses 67. One memory device is connected to the data buses 67 on the front of the module 63, and the other memory device is connected to the data buses 67 on the rear of the module 63.

That is, each of the data buses 67 extends from the tab 68 on the front of the module 63 to each of the memory devices 65 mounted on the front of the module 63 and extends from each of the memory devices 65 mounted on the front of the module 63 to each of the memory devices 65a mounted on the rear of the module 63 through each of the vias 66. Also, each of the data buses 67 extends from each of the memory devices 65a mounted on the rear of the module 63 to the tab 68 on the rear of the module 63.

The control/address bus 62 extends from the tab 68 on the front of the module 63 to the tab 68 on the rear of the module 63 through via 66a. A first control/address stub 64 are diverged from a point x of the control/address bus 62 on the front of the module 63 and is commonly connected to the memory devices 65 mounted on the front of the module 63. A second control/address stub 64a is diverged from a point y of the control/address bus 62 on the rear of the module 63 and is commonly connected to the memory devices 65a mounted on the rear of the module 63.

Each of the stub terminating resistances R1 and R2 is connected between both ends of the control/address stub 64 and a termination voltage Vterm. Also, although not shown, stub resistances are connected between both ends of the control/address stub 64a and a termination voltage Vterm Meanwhile, in order to improve high-speed operation characteristics, a buffer or a register for driving the control/address stub 64 may be included at the divergence point x, and a buffer or a register for driving the control/address stub 64a may be included at the divergence point y. Preferably, the control/address stubs 64 and 64a are formed in a direction of one side of the module 63 on which the tab 68 is formed, that is, in a horizontal direction, and the data buses 67 having a short loop-through form and the control/address bus 62 are formed to be perpendicular to one side of the module 63, that is, in a vertical direction.

Figure 7A:
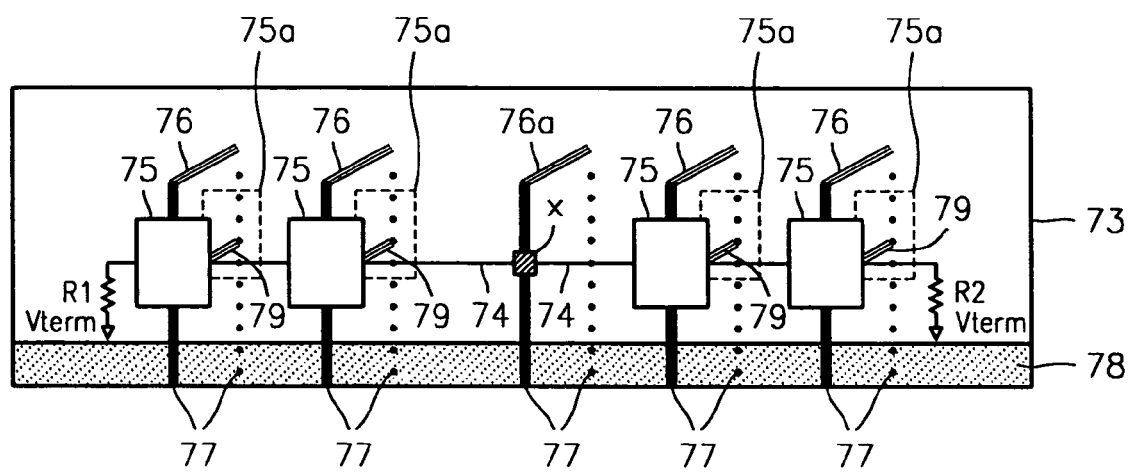
FIG. 7A is a diagram illustrating a third embodiment of the memory module according to the present invention of FIG. 3.
Figure 7B:
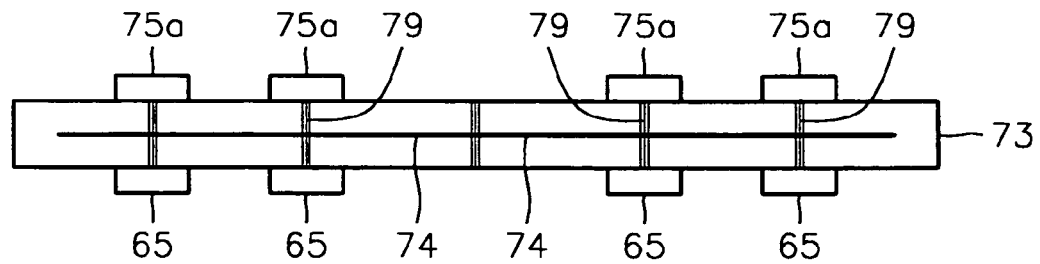
FIG. 7B is a profile illustrating the memory module according to the third embodiment of the present invention of FIG. 7A.

Referring to FIGS. 7A and 7B, a memory module 73 according to a third embodiment of the present invention includes a plurality of memory devices 75 which are mounted on the front of the module 73 as the memory module 63 according to the second embodiment of FIG. 6A, a plurality of memory devices 75a which are mounted on the rear of the module 73, a plurality of vias 76 and 76a for connecting two different signal layers of the module 73, a plurality of data buses 77, a control/address bus 72, and a tab 78.

However, the memory module 73 according to the third embodiment includes only one control/address stub 74, and each of the memory chips (75, 75a) commonly connected by the control/address stub (74) as compared to the memory module 63 according to the second embodiment, which has two. The control/address stub 74 is diverged from a point x of the control/address bus 72 and is commonly connected to all memory devices 75 and 75a, which are mounted on the front and rear of the module 73, through connecting lines 79. Stub terminating resistances R1 and R2 are connected between both ends of the control/address stub 74 and a termination voltage Vterm, respectively.

Since other components are the same as those of the memory module 63 according to the second embodiment, detailed descriptions thereof will be omitted.

The preceding memory modules according to the first through third embodiments, that is, the memory modules in which the data buses are constituted of a short loop-through form and the control/address bus is constituted of a short loop-through form to which a stub is added, are suitable for the case where the control/address bus is operated by comparatively low frequency. In other words, in the latest high-speed systems, the control/address bus is operated in much slower speed than the data bus, and then, the memory modules according to the first through third embodiments can be used in systems with a low clock frequency.

However, in a case where the clock frequency is high, or if the number of memory devices on the module increases, the load of the control/address stub is large, and, as a result, signal distortion is large, and signal transmission is delayed. Thus, in this case, the memory modules comprising a buffer or a register for driving the control/address stub may be used at the point where the control/address stub is diverged from the control/address bus. In the modules, similarly to the data buses, the control/address bus can be operated by a high frequency.

Figure 8:
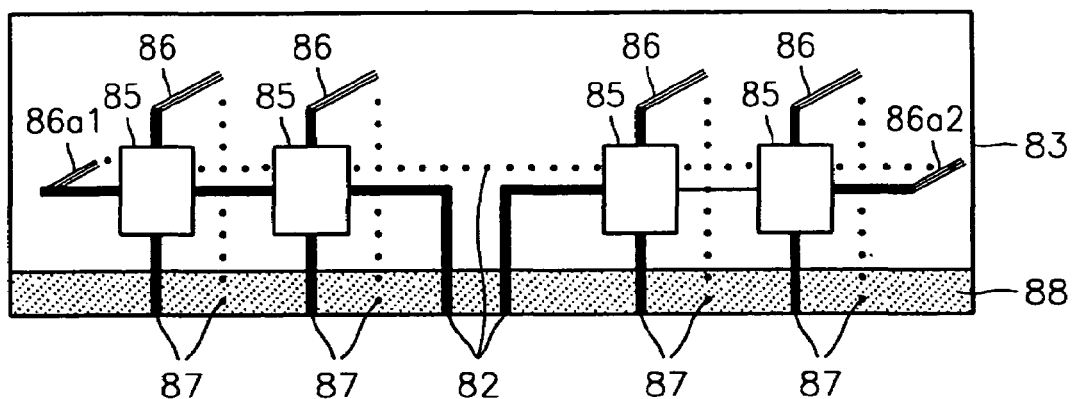
FIG. 8 is a diagram illustrating a fourth embodiment of the memory module according to the present invention of FIG. 3.

Referring to FIG. 8, a memory module 83 according to a fourth embodiment of the present invention includes a plurality of memory devices 85 which are mounted on the front of the module 83, a plurality of vias 86, 86a1 and 86a2 for connecting two different signal layers of the module 83, a plurality of data buses 87, a control/address bus 82, and a tab 88. In FIG. 8, the data buses 87 are constituted of a short loop-through form, and the control/address bus 82 is constituted of a short loop-through form in a horizontal direction of the module 83, and the memory devices 85 are four in number.

The memory devices 85, the vias 86, the data buses 87, and the tab 88 are the same as those of FIG. 3. Thus, detailed descriptions thereof will be omitted.

Here, an assumption is made that the control/address bus 82 has an input/output pin in the middle of the tab 88 on the front of the module 83, and that the data buses 87 are centered at the control/address bus 82, and symmetrically arranged on both sides of the control/address bus 82, and that the memory devices 85 are mounted only on the front of the module 83.

The control/address bus 82 extends from a point in the middle of the tab 88 and is sequentially connected to the memory devices 85 which are centered at the control/address bus 82 and mounted on the left side of the module 83. Also, the control/address bus 82 passes through the board at via 86a1 and is interconnected from the left side to the right side on the rear of the module 83. After that, the control/address bus 82 passes back through via 86a2 and is sequentially connected to the memory devices 85 which are centered at the control/address bus 82 and mounted on the right side of the module 83, and then, extends to another point in the middle of the tab 88.

Preferably, the control/address bus 82 is formed in a direction of one side of the module 83 on which the tab 88 is formed, that is, in a horizontal direction, and the data buses 87 are formed to be perpendicular to the direction in which the tab 88 is formed, that is, in a vertical direction.

Figure 9:
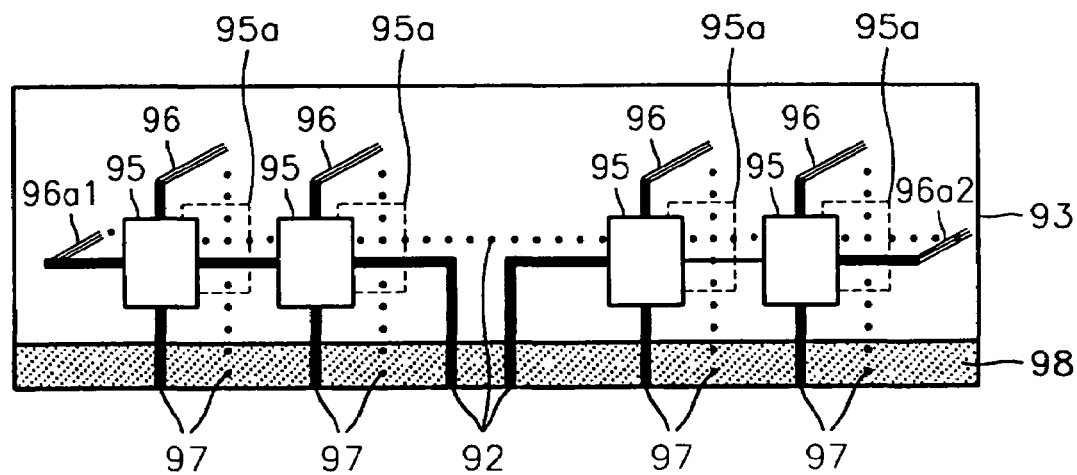
FIG. 9 is a diagram illustrating a fifth embodiment of the memory module according to the present invention of FIG. 3.

Referring to FIG. 9, a memory module 93 according to a fifth embodiment of the present invention includes a plurality of memory devices 95 which are mounted on the front of the module 93, a plurality of memory devices 95a which are mounted on the rear of the module 93, a plurality of vias 96, 96a1, and 96a2 for connecting two different signal layers of the module 93, a plurality of data buses 97, a control/address bus 92, and a tab 98. In FIG. 9, the data buses 97 are constituted of a short loop-through form, and the control/address bus 92 is constituted of a short loop-through form in a horizontal direction of the module 93, and the memory devices 95 are eight.

Each of the data buses 97, as in the second embodiment of FIG. 6A, extends from the tab 98 on the front of the module 93 to the tab 98 on the rear of the module 93 through each of the vias 96, and two memory devices are connected to each of the data buses 97. One memory device is connected to the data buses 97 on the front of the module 93, and the other memory device is connected to the data buses 97 on the rear of the module 93.

That is, each of the data buses 97 extends from the tab 98 on the front of the module 93 to each of the memory devices 95 mounted on the front of the module 93 and extends from each of the memory devices 95 mounted on the front of the module 93 to each of the memory devices 95a mounted on the rear of the module 93 through each of the vias 96. Also, each of the data buses 97 extends from each of the memory devices 95a mounted on the rear of the module 93 to the tab 98 on the rear of the module 93.

The control/address bus 92 extends from a point in the middle of the tab 98 and is sequentially connected to the memory devices 95 which are centered at the control/address bus 92 and mounted on the left side of the module 93. Also, the control/address bus 92 passes the via 96a1 and is sequentially connected to the memory devices 95a which are mounted on the rear of the module 93. After that, the control/address bus 92 passes the via 96a2 and is sequentially connected to the memory devices 95 which are centered at the control/address bus 92 and mounted on the right side of the module 93, and then, extends to another point in the middle of the tab 98.

Preferably, the control/address bus 92 is formed in a direction of one side of the module 93 on which the tab 98 is formed, that is, in a horizontal direction, and the data buses 97 are formed to be perpendicular to the direction in which the tab 98 is formed, that is, in a vertical direction.

Figure 10:
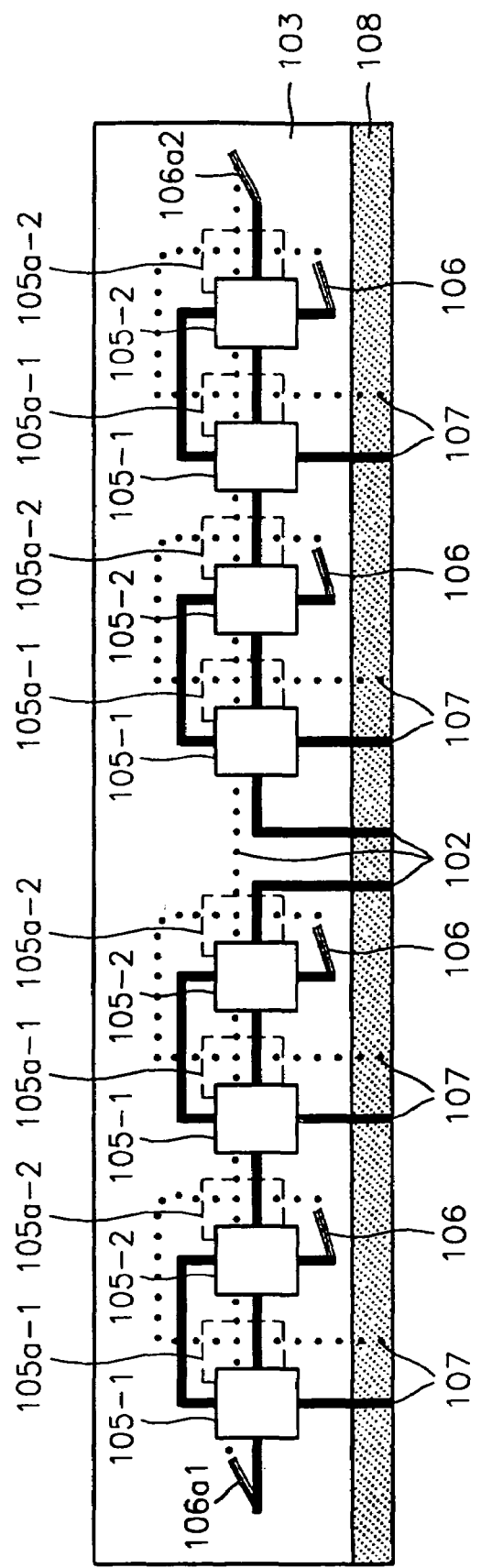
FIG. 10 is a diagram illustrating a sixth embodiment of the memory module according to the present invention of FIG. 3.

Referring to FIG. 10, a memory module 103 according to a sixth embodiment of the present invention includes a plurality of memory devices 105-1 and 105-2 which are mounted on the front of the module 103, a plurality of memory devices 105a-1 and 105a-2 which are mounted on the rear of the module 103, a plurality of vias 106, 106a1, and 106a2 for connecting two different signal layers of the module 103, a plurality of data buses 107, a control/address bus 102, and a tab 108. In FIG. 10, the data buses 107 are constituted of a short loop-through form, and the control/address bus 102 is constituted of a short loop-through form in a horizontal direction of the module 103, and the memory devices 105-1, 105-2, 105a-1, and 105a-2 are sixteen.

Each of the data buses 107 extends from the tab 108 on the front of the module 103 to the tab 108 on the rear of the module 103 through each of the vias 106, and four memory devices are connected to each of the data buses 107. Two memory devices are connected to each of the data buses 107 on the front of the module 103, and the other two memory devices are connected to each of the data buses 107 on the rear of the module 103.

That is, each of the data buses 107 extends from the tab 108 on the front of the module 103 to the first memory devices 105-1 mounted on the front of the module 103 and extends from the first memory devices 105-1 to the neighboring second memory devices 105-2. Also, each of the data buses 107 extends from the second memory devices 105-2 mounted on the front of the module 103 to the third memory devices 105a-2 mounted on the rear of the module 103 through each of the vias 106. Also, each of the data buses 107 extends from the third memory devices 105a-2 to the neighboring fourth memory devices 105a-1 and extends from the fourth memory devices 105a-1 to the tab 108 on the rear of the module 103. In FIG. 10, although four memory devices are connected to each of the data buses 107, it is evident that more memory devices can be connected to the data buses 107.

The control/address bus 102 extends from a point in the middle of the tab 108 and is sequentially connected to the memory devices 105-1 and 105-2 which are centered at the control/address bus 102 and mounted on the left side of the module 103. Also, the control/address bus 102 passes the via 106a1 and is sequentially connected to the memory devices 105a-1 and 105a-2 which are mounted on the rear of the module 103. After that, the control/address bus 102 passes the via 106a2 and is sequentially connected to the memory devices 105-1 and 105-2 which are centered at the control/address bus 102 and mounted on the right side of the module 103, and then, extends to another point in the middle of the tab 108.

Preferably, the control/address bus 102 is formed in a direction of one side of the module 103 on which the tab 108 is formed, that is, in a horizontal direction, and the data buses 107 are formed to be perpendicular to the direction in which the tab 108 is formed, that is, in a vertical direction.

The preceding memory modules according to the fourth through sixth embodiments, that is, the memory modules in which the control/address bus as well as the data buses are constituted of short loop-through forms, can be operated by a high frequency in high-speed without extra devices such as a buffer or a register.

As described above, the memory module according to the present invention of FIG. 3 can be variously applied as in the preferred embodiments of FIGS. 5 through 10. Meanwhile, as described, the memory module employs a loop-through form in which the memory devices are direct connected to the data buses without a stub. However, in the memory module according to the present invention, the data buses are arranged in a vertical direction of the module, and then, the length of the entire channel is greatly reduced, as compared to the conventional loop-through form of FIG. 2.

Thus, the memory module of the present invention reduces the length of the entire channel while maintaining the advantages of the conventional loop-through form, as a result, a signal transmission delay time on the channel is shortened, and electron wave interference is reduced. As this happens, high-speed characteristics are improved.

Also, since fewer memory devices are mounted on the channel, as compared to the conventional loop-through form, the capacity load is reduced, and the impedance of the channel is maintained or increased, leading to a relative reduction in cost for fabricating systems such as PCBs and module connectors. Also, since the buses are input/output through one side of the module and the input pins of the buses are located in the tab on the front of the module and the output pins of the buses are located in the tab on the rear of the module, it is easier for systems to be constituted. Also, since the memory module increases the number of the memory devices on the module, it is easy for capacity to be extended.

Further, as described in the preferred embodiments of FIGS. 5 through 10, preferably, the control/address bus is formed in a direction of one side of the module on which the tab is formed, that is, in a horizontal direction, and the data buses are formed to be perpendicular to one side of the module, that is, in a vertical direction. In the above interconnection architecture, since the degree of freedom of the interconnection increases, compared to the case where two buses are arranged in the same direction, a simple design layout is possible, and since the two respective control and data buses are perpendicularly arranged, noise by mutual interference between the two buses can be minimized.

As a consequence, since the memory module reduces the length of the entire channel, the memory module is suitable for a high-speed operation. Further, the memory module reduces costs for fabricating systems such as a PCBs and a module connectors and enables to constitute a short loop-through form memory bus architecture capable of simplifying the configuration of systems.

While this invention has been particularly shown and described with references to preferred embodiments thereof, it will be understood by those skilled in the art that various changes in form and details may be made therein without departing from the spirit and scope of the invention as defined by the appended claims.

Figure 11A:
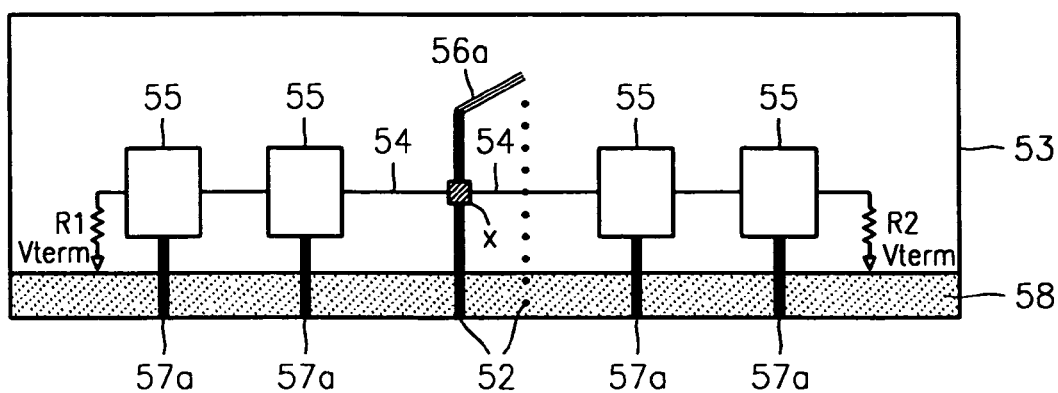
FIG. 11A is a diagram illustrating a memory module configuration wherein the data buses are provided in a stub configuration, and wherein the control/address buses are provided in a loop-through configuration.

For example, in an alternative embodiment, the control/address bus may be provided in a short loop-through configuration, while, on the same module, the data bus may be provided in a stub configuration. With reference to FIG. 11A, a plurality of memory devices are provided on a first face of a memory module 53. A plurality of data buses 57A source data to the memory devices, as described above. The data buses 57A are in a stub configuration, as described above. A control address/bus 52 is provided in a loop-through configuration, with an optional buffer x, as described above, with reference to FIGS. 5–7. This configuration also applies to the case where memory devices are located on the front and back faces of the module.

Figure 11B:
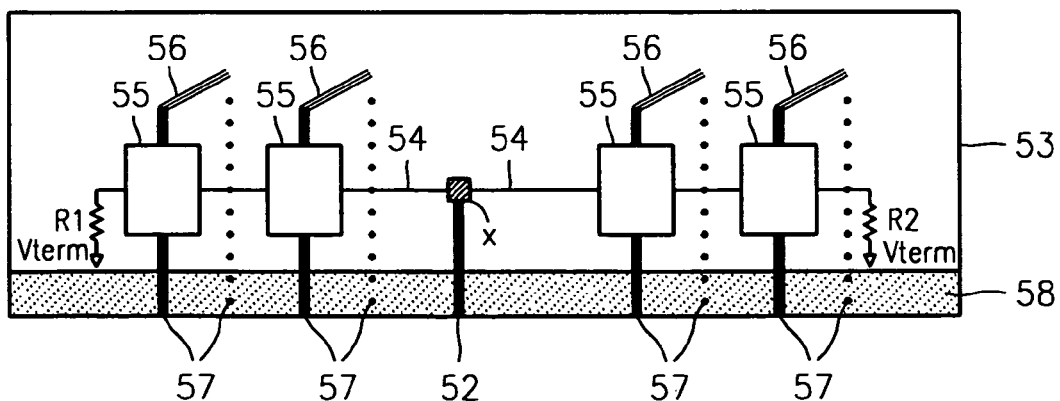
FIG. 11B is a diagram illustrating a memory module configuration wherein the data buses are provided in a loop-through configuration, and wherein the control/address buses are provided in a stub configuration.

Similarly, a configuration may be provided wherein the control/address bus may be provided in a stub configuration, while, on the same module, the data bus may be provided in a short loop-through configuration. With reference to FIG. 11B, a plurality of memory devices are provided on a first face of a memory module 53. A plurality of data buses 57 source data to the memory devices, as described above. The data buses 57 are in a short loop-through configuration, as described above. A control/address bus 52A is provided in a stub configuration, with an optional buffer x. This configuration also applies to the case where memory devices are located on the front and back faces of the module.

What is claimed is:

1. A memory module on which a plurality of memory devices are mounted, comprising:
   a plurality of tabs located on a front side and a rear side of the memory module for interfacing with a connector on a system board, wherein the plurality of tabs are grouped into corresponding sets of tabs on the front side and the rear side of the memory module, and wherein the sets of tabs comprise sets of data bus tabs and control/address bus tabs;

a first memory device and a neighboring second memory device mounted on the front side of the memory module;

a third memory device and a neighboring fourth memory device mounted on the rear side of the memory module;

a first data bus extending from a first set of data bus tabs on the front side of the memory module to the first memory device, extending from the first memory device to the second memory device, extending from the second memory device to the third memory device through a first via, extending from the third memory device to the fourth memory device, and extending from the fourth memory device to a first set of data bus tabs on the rear side of the memory module; and a control/address bus extending from a first set of control/address bus tabs on the front side of the memory module to the first and the second memory devices, and commonly connecting to the first and the second memory devices, and extending from the front side of the memory module to the rear side of the memory module through a second via.

2. The memory module of claim 1, further comprising:

a fifth memory device and a neighboring sixth memory device mounted on the front side of the memory module; and a seventh memory device and a neighboring eighth memory device mounted on the rear side of the memory module.

3. The memory module of claim 2, further comprising a second data bus extending from a second set of data bus tabs on the front side of the memory module to the fifth memory device, extending from the fifth memory device to the sixth memory device, extending from the sixth memory device to the seventh memory device through a third via, extending from the seventh memory device to the eighth memory device, and extending from the eighth memory device to a second set of data bus tabs on the rear side of the memory module.

4. The memory module of claim 2, wherein the control/address bus extends from the first set of control/address bus tabs on the front side of the memory module to the first and second memory devices, extends from the second memory device to the fifth memory device, extends from the fifth memory device to the sixth memory device, and commonly connects to the first, second, fifth, and sixth memory devices.

5. The memory module of claim 4 wherein the control/address bus extends from one of the memory devices on the rear side of the memory module through a fourth via to the front side of the memory module, and extends to a second set of control/address bus tabs on the front side of the memory module.

6. The memory module of claim 4 wherein the first set of control/address bus tabs are located in a central region of the plurality of tabs on the front side of the memory module, and wherein the first, second, third, fourth, fifth, sixth, seventh, and eighth memory devices are located at one of a left and right sides of the memory module relative to the central region.

7. The memory module of claim 2, wherein the control/address bus extends from the first set of control/address bus tabs on the front side of the memory module to the first, second, fifth, and sixth memory devices, commonly connecting to the first, second, fifth, and sixth memory devices on the front side of the memory module, and extends from the front side of the memory module to the rear side of the memory module through the second via, commonly connecting to the third, fourth, seventh, and eighth memory devices on the rear side of the memory module.

8. The memory module of claim 7 wherein the control/address bus extends from one of the memory devices on the rear side of the memory module through a fourth via to the front side of the memory module, and extends to a second set of control/address bus tabs on the front side of the memory module.

9. The memory module of claim 7 wherein the first set of control/address bus tabs are located in a central region of the plurality of tabs on the front side of the memory module, and wherein the first, second, third, fourth, fifth, sixth, seventh, and eighth memory devices are located at one of a left and right sides of the memory module relative to the central region.

10. The memory module of claim 2, wherein the first, second, third, and fourth memory devices are located at one of a left and right side of the memory module relative to the first set of control/address bus tabs, and wherein the fifth, sixth, seventh, and eighth memory devices are located at the other of the left side and right side of the memory module relative to the first set of control/address bus tabs.

11. The memory module of claim 10, wherein the control/address bus extends from the first set of control/address bus tabs to the first memory module and sequentially connects the first, second, third, and fourth memory devices on the one of the left and right sides of the memory module, extends from the fourth memory device to the eighth memory device, and sequentially connects the eighth, seventh, sixth and fifth memory devices, and extends from the fifth memory device to a second set of control/address bus tabs.

12. The memory module of claim 11 wherein the first and second sets of control/address bus tabs are located in a central region of the plurality of tabs on the front side of the memory module.

13. The memory module of claim 11, wherein an additional plurality of memory devices are sequentially connected by the control/address bus between at least one of the second and the fourth memory devices and the sixth and the seventh memory devices.

14. The memory module of claim 11, wherein the second set of control/address bus tabs are located in a central region on the front side of the memory module.

15. The memory module of claim 11, wherein the memory module includes a fourth via for connecting the control/address bus between the sixth and seventh memory devices.

16. The memory module of claim 1, wherein the control/address bus includes at least one of a control signal bus and an address bus.

17. The memory module of claim 1, wherein the memory module further comprises a plurality of vias for connecting two different signal layers of the memory module.

18. The memory module of claim 1, wherein the first data bus is configured in a short-loop-through configuration, and wherein the control/address bus is configured in a short-loop through configuration.

19. The memory module of claim 1, wherein the control/address bus extends from the first set of control/address bus tabs to the first memory device in a vertical direction and extends between neighboring memory devices on the module in a horizontal direction.

20. The memory module of claim 1, wherein the first set of control/address bus tabs are located in a central region on the front side of the memory module.

* * * * *